United States Patent [19]
Ogle

[11] Patent Number: 5,435,881
[45] Date of Patent: Jul. 25, 1995

[54] APPARATUS FOR PRODUCING PLANAR PLASMA USING VARYING MAGNETIC POLES

[76] Inventor: John S. Ogle, 1472 Pashote Ct., Milpitas, Calif. 95035

[21] Appl. No.: 210,173

[22] Filed: Mar. 17, 1994

[51] Int. Cl.$^6$ ............................................. C23F 1/02
[52] U.S. Cl. ............................ 156/345; 118/723 MA; 204/298.16
[58] Field of Search .............. 118/723 MP, 723 MA; 156/345; 204/298.16, 298.17, 298.18, 298.19, 298.2, 298.21, 298.22, 298.37

[56] References Cited
U.S. PATENT DOCUMENTS

| | | | |
|---|---|---|---|
| 4,947,085 | 8/1990 | Nakanishi | 315/111.41 |
| 4,948,458 | 8/1990 | Ogle | 156/643 |
| 5,122,251 | 1/1992 | Campbell | 204/298.06 |
| 5,198,725 | 3/1993 | Chen | 315/111.41 |
| 5,277,751 | 1/1994 | Ogle | 156/643 |

Primary Examiner—R. Bruce Breneman
Assistant Examiner—Joni Y. Chang
Attorney, Agent, or Firm—Thomas E. Schatzel

[57] ABSTRACT

A plasma generation system comprises a two-by-two or larger array of alternating magnetic poles set proximate to an insulating window in a chamber containing a process gas. The magnetic poles are ferromagnetic core coils driven by a radio frequency power source at sufficient energies to generate a plasma within the process gas chamber. The magnetic poles are included in ferromagnetic core coils that are wired to the radio frequency power source such that each magnetic pole is surrounded equally in the plane of the insulating window by adjacent magnetic poles of opposite magnetic polarity and uniform magnitudes. In a two-by-two array, the two sets of opposite corners have opposite magnetic polarities.

21 Claims, 4 Drawing Sheets

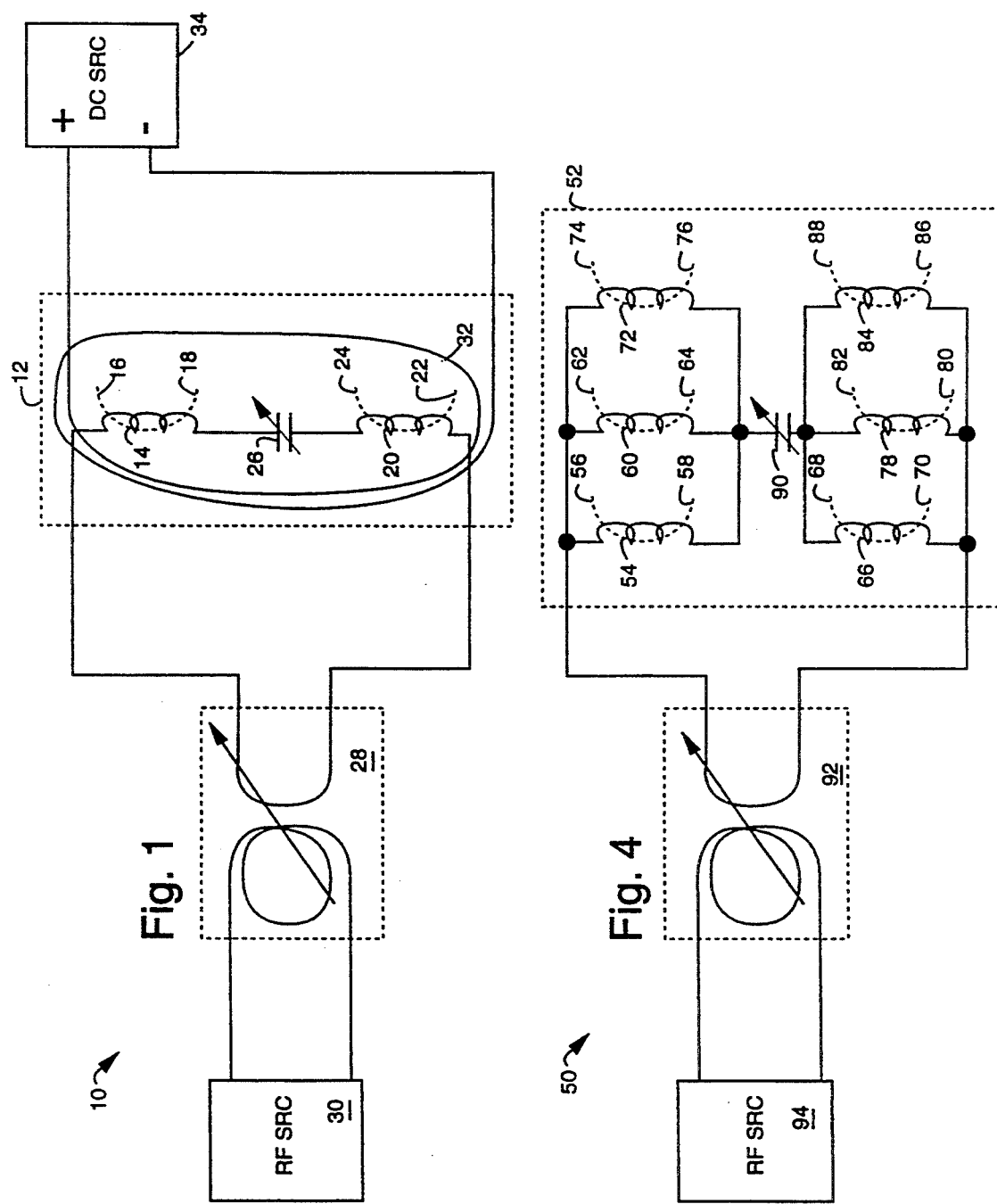

APPARATUS FOR PRODUCING PLANAR PLASMA USING VARYING MAGNETIC POLES

BACKGROUND OF THE INVENTION

1. Field of the Invention

The present invention relates generally to apparatus for producing low pressure partially-ionized gases, e.g., plasmas, and more particularly to the production of highly uniform plasmas useful for treating planar materials such as semiconductor wafers in low pressure processing equipment. Such treatment can include etching, deposition, cleaning, and ion implantation.

Plasma generation is useful in a variety of semiconductor fabrication processes including etching, deposition, ion implantation and the like. Plasmas are generally produced in a low pressure gas by accelerating naturally occurring free electrons in the gas to the gas ionization energy, typically between five and twenty electron volts. Collisions between these energetic electrons and the gas molecules occasionally cause a molecule to be ionized, releasing an additional free electron. Each additional free electron is also accelerated and can also ionize gas molecules. The resultant partially ionized gas is called a plasma.

2. Description of the Prior Art

Plasma producing methods are conventionally based on providing a gas tight chamber, gas pumps and flow control means for accurate control of gas flow and pressure for one or more process gases, and adding energy to free electrons in the gases so that these electrons are accelerated to the ionization energy of the gas molecules. Ionization of process gas molecules frees additional electrons that can also be accelerated to ionization energy.

In semiconductor wafer processing in a gas the process rate can be increased by increasing the energy of the gas molecules. This increased energy can be in the form of molecule ionization, in a dissociation of the molecules into smaller molecules, in a driving of the molecular electrons into higher energy levels, and in other modes. Positively-charged ions can also be accelerated to increased kinetic energies that can be directionally controlled. Steady-state electric fields are conventionally used to control both the magnitude and the direction of ion kinetic energy.

The imparting of energy to free electrons in a gas is typically accomplished with electrical fields, varying magnetic fields, or both.

One traditional method used in semiconductor wafer processing for both Generating the plasma and accelerating the resulting ions involves placing an alternating current (AC) voltage between two electrodes inside a gas-tight chamber, with a wafer to be processed held on one of the electrodes. The applied AC voltage accelerates free electrons in the gas between the electrodes up to the ionization energy level of the process gas molecules, thereby generating a plasma. A direct current (DC) voltage between the plasma and the wafer held on the wafer electrode also results.

The free electrons in the plasma move easily from the plasma to the semiconductor wafer when the wafer electrode is at a maximum positive voltage, and do not move from the wafer, even when the wafer is at a negative voltage relative to the plasma. A rectifier is thus provided that is equivalent to a thermionic diode vacuum tube, where electron current flows from a heated cathode to a cooler plate, but not the reverse.

A single source of energy, from the AC voltage between the electrodes, controls both the number of ions generated (the ion flux, or ion density of the plasma) and the kinetic energy with which each ion strikes the wafer (the ion field). Some control over the ratio between the ion flux and the ion field can be achieved by varying the gas pressure, the alternating current power frequency, and the chamber configuration.

The narrower line widths required for modern semiconductor devices requires independent control over the ion flux and the ion field, and the capability of operating at low pressure, in the range of one to ten millitorr. A number of plasma generation systems have been developed to provide the required independent control of ion flux and ion field at low pressures. Several configurations use the electron cyclotron resonance (ECR) principle, wherein radio frequency power is applied to a gas and a constant magnetic field applied at right angles to the varying electric field of the radio frequency power. The constant magnetic field is adjusted so that the curvature of the electron path due to the constant magnetic field results in a circular electron path at the same frequency as the radio frequency power. A common combination of frequency and magnetic field is 2.45 Gigahertz and 875 gauss.

An ECR plasma source can provide a plasma with high ion flux at low pressure, with a low ion field (kinetic energy of the ions striking the wafer). The ion field can be increased and controlled by an independent alternating current voltage on the wafer electrode. However, ECR systems are expensive and difficult to adjust.

There are several configuration variations using a varying magnetic field passing through an electrically insulating cylindrical process gas chamber for plasma generation. These variations couple the electron acceleration energy through the insulating cylinder walls by different arrangements of varying magnetic fields. One advantage claimed to this configuration is that wafer damage can be reduced by generating the plasma distant from the wafer and flowing the energized gas from the plasma generation location to the wafer. This general approach is called downstream plasma generation. Current experience indicates little, if any, advantage in terms of wafer damage for downstream plasma generation, and a serious reduction in process rate.

The optimum configuration for generating a plasma for semiconductor wafer processing makes a high ion flux planar plasma adjacent to the wafer, with low ion field (ion kinetic energy), and provides an independent power source for increasing and controlling the ion field. In general, the goal is to cause a uniform flux of ions to strike the wafer at a right angle, with the flux and field independently controlled.

A planar plasma source is described in U.S. Pat. No. 4,948,458, METHOD AND APPARATUS FOR PRODUCING MAGNETICALLY-COUPLED PLANAR PLASMA, issued to the present inventor, John S. Ogle, and which uses a spiral planar coil to generate a varying magnetic field that passes through an insulating window and accelerates free electrons in the process gases in a circular path parallel to the turns of the coil. This configuration provides efficient plasma generation with low ion kinetic energy, but has a "dead" area corresponding to the center of the coil in which there is much less electron acceleration.

Another planar plasma source is described in U.S. Pat. No. 5,277,751, METHOD AND APPARATUS FOR PRODUCING LOW PRESSURE PLANAR PLASMA USING A COIL WITH ITS AXIS PARALLEL TO THE SURFACE OF A COUPLING WINDOW, also issued to the present inventor, john S. Ogle, which uses a coil with its axis parallel to the window. The forward magnetic field is inside the coil and does not contribute to plasma Generation. However, part of the return magnetic field passes through the window and couples energy to the free electrons in the process gases.

SUMMARY OF THE PRESENT INVENTION

It is therefore an object of the present invention to provide a system for generating a suitably uniform low pressure planar plasma.

Briefly, an embodiment of the present invention is a plasma system comprising a number of varying magnetic field sources. Rather than a single varying magnetic field covering an entire plasma chamber window area, four or more varying magnetic poles are used. Typically, six magnetic poles for a one-dimensional magnetic pole arrangement and twelve magnetic poles for a two-dimensional magnetic pole arrangement are used. These poles are substantially equally spaced, and adjacent poles have opposite instantaneous polarity. A varying magnetic field therefore exists between each pole and each adjacent pole. These varying magnetic fields accelerate the free electrons of a process gas contained in the chamber in a direction generally parallel to the window surface.

An advantage of the present invention is that it provides a plasma system in which the area of plasma generation is indefinitely extendible by simply adding more varying magnetic poles.

A further advantage of the present invention is that a system is provided in which the magnetic fields do not extend far into the process gases, reducing the chance of coupling energy directly into the surface being processed.

Another advantage of the present invention is that a system is provided in which the local concentrations of magnetic field variation make it possible to initiate a plasma at low pressure with less radio frequency power and reduces the tendency of low pressure plasma concentrations to jump from one location to another.

A still further advantage of the present invention is that a system is provided in which areas of non-uniform plasma generation are small, relative to the total plasma generation area.

A further advantage of the present invention is that a system is provided in which is relatively much easier to adjust for optimum process uniformity.

These and other objects and advantages of the present invention will no doubt become obvious to those of ordinary skill in the art after having read the following detailed description of the preferred embodiments that are illustrated in the various drawing figures.

IN THE DRAWINGS

FIG. 1 is a schematic of a ferromagnetic core coil planar plasma generating system embodiment of the present invention with four poles;

FIGS. 2A and 2B diagram in plan view the polarities of the magnetic poles of the ferromagnetic core coils of the system of FIG. 1 at times of maximum current flow separated in time by a half cycle;

FIG. 4 is a schematic of a planar plasma generating system embodiment of the present invention using six ferromagnetic core coils that have twelve magnetic poles;

Figure 5B:
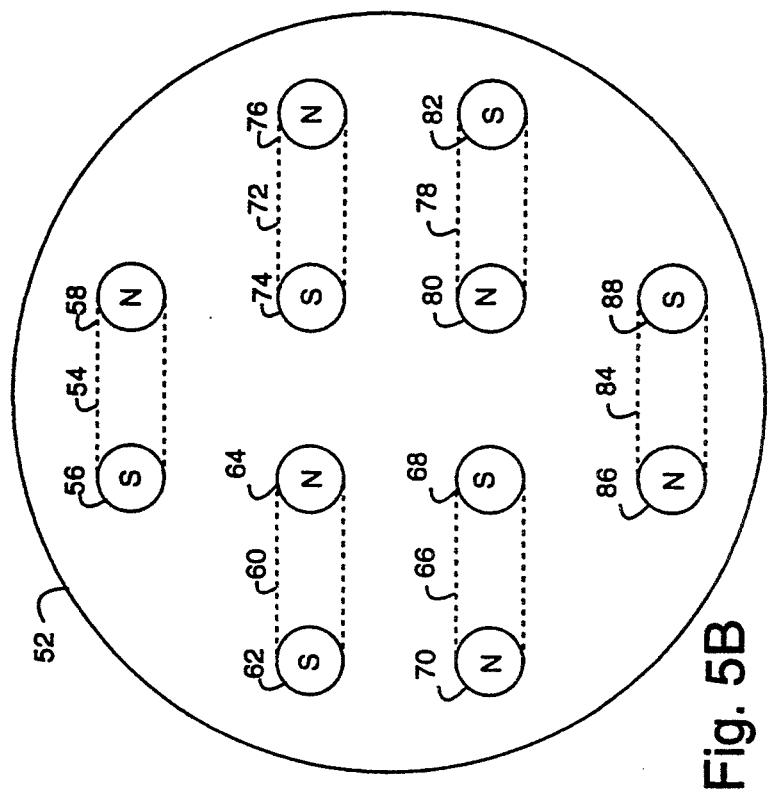
Figure 5A:
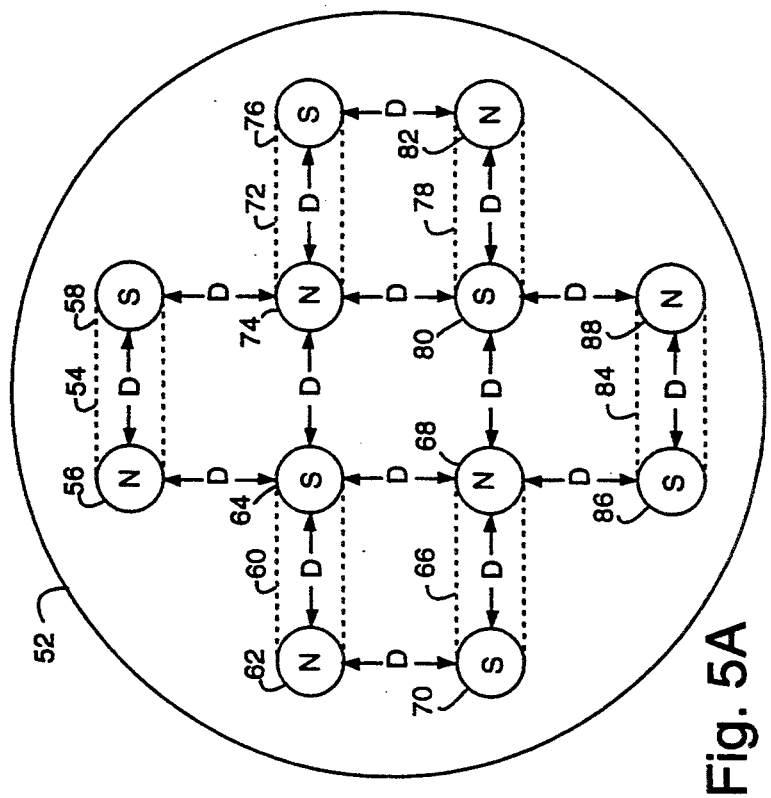
Figure 6:
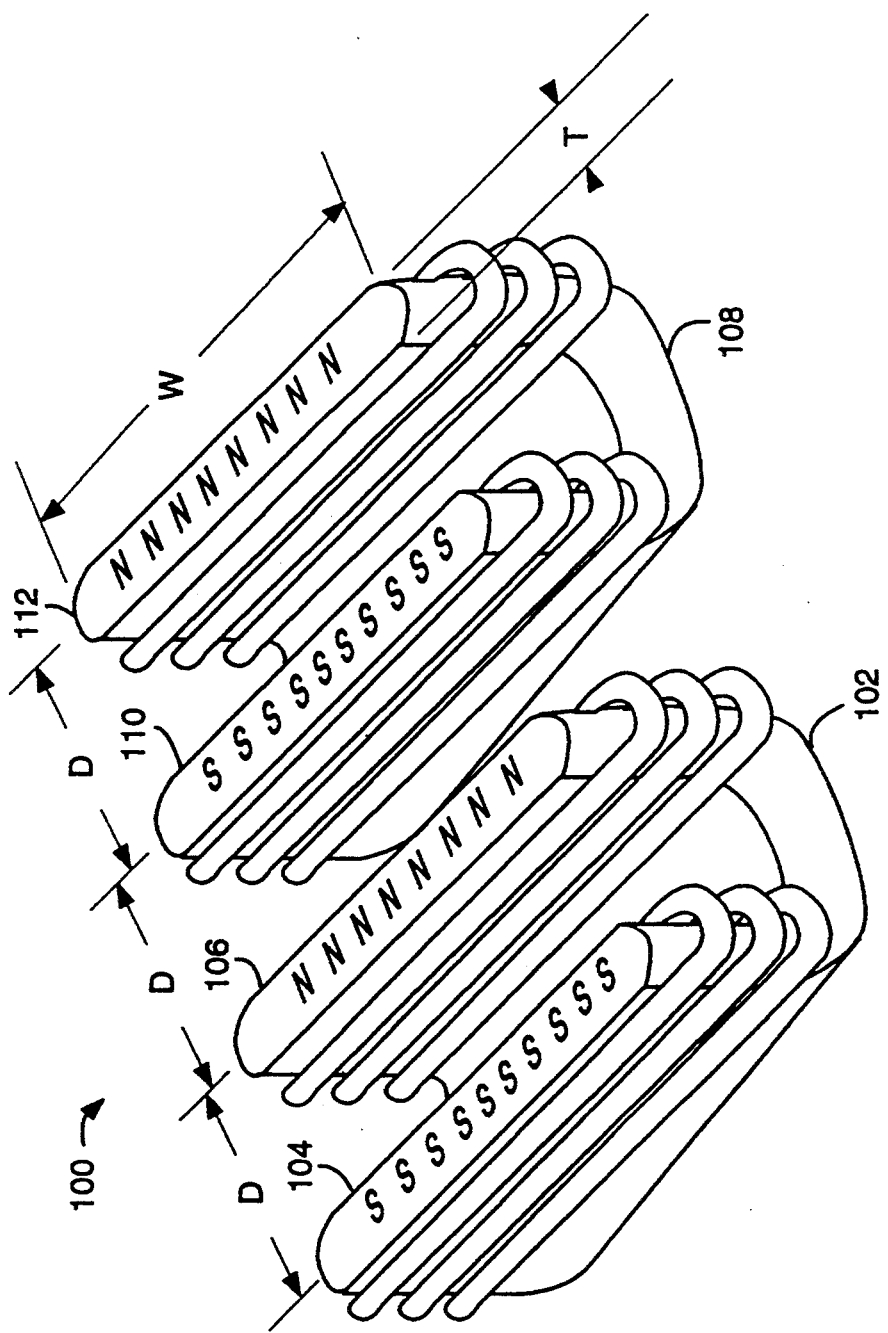

FIGS. 5A and 5B diagram in plan view the relative positions of the magnetic poles of the system of FIG. 4 separated in time by a half cycle corresponding to maximum positive and negative current flows through the ferromagnetic core coils; and FIG. 6 is a perspective view of a pair of elongated ferromagnetic core coils of the present invention which provide four elongated magnetic poles for generating one-dimensional electron acceleration fields.

DETAILED DESCRIPTION OF THE PREFERRED EMBODIMENTS

FIG. 1 illustrates a varying magnetic pole plasma excitation system embodiment of the present invention, referred to by the general reference numeral 10. System 10 is intended to be placed proximate to an insulating window of ceramic, quartz or other insulating material, mounted on a chamber that contains a low pressure process gas. For example, such chambers are described in U.S. Pat. Nos. 4,948,458, and 5,277,751, both of which issued to the present inventor, John S. Ogle, and both of which are incorporated herein by reference.

System 10 comprises a mounting plate 12 that supports a first ferromagnetic core coil 14 with a pair of magnetic poles 16 and 18, and a second ferromagnetic core coil 20 with a pair of magnetic poles 22 and 24. Ferromagnetic core coils 14 and 20 are wired in series with a variable capacitor 26. Radio frequency (RF) power is coupled into system 10 through an air-core variable transformer 28 from a RF source 30.

A typical operating frequency of 13.56 MHz is used for RF power source 30. Ferromagnetic core coils 14 and 20 preferably comprise several turns of copper wire or tubing on a half-toroid powdered iron or ferrite core or U-core with a generous space allowed between the windings and the core to promote cooling and to limit the heating that would otherwise result from a too tightly coupled Winding. Forced air cooling for the windings may be necessary in certain implementations. The mounting plate 12 is an aluminum sheet with holes cut to allow magnetic poles 16, 18, 22 and 24 to peek out toward a process gas chamber window and a slot cut through the aluminum sheet that connects each hole to an adjacent hole. Insulating rings or collars to grommet the magnetic poles 16, 18, 22 and 24 in the mounting sheet 12 can be used to provide mounting support for ferromagnetic core coils 14 and 20.

A coil 32 may also be used to provide a constant magnetic field as a consequence of being connected to a DC power source 34. Such constant magnetic field is conventionally used in the prior art to curve the electron path to reduce the number of excited electrons in the plasma that encounter the walls of the process gas chamber, or to provide the electron cyclotron resonance (ECR) condition.

Figure 2A:
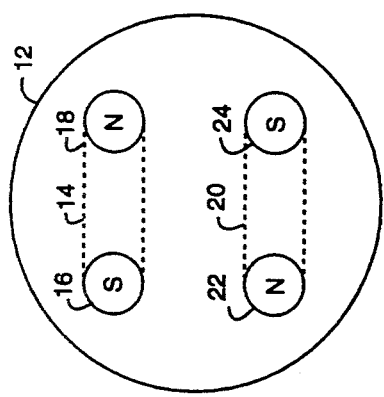
Figure 2B:
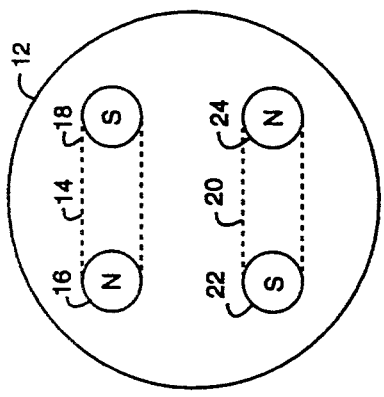

FIGS. 2A and 2B illustrate the physical relationships between magnetic poles 16, 18, 22 and 24. The distance between magnetic poles 16 and 18 is preferably substantially the same as the distances between magnetic poles 22 and 24, between magnetic poles 16 and 22, and between magnetic poles 18 and 24. Ferromagnetic core coils 14 and 20 are interconnected such that for each cycle of RF input power, magnetic poles 16 and 22 will be opposite, as will magnetic poles 18 and 24. FIG. 2A illustrates this for one cycle of RF input power by labeling magnetic poles 16 and 24 with north (N) and magnetic poles 18 and 22 with south (S). FIG. 2B illustrates this for a next half cycle of RF input power by labeling magnetic poles 16 and 24 with south (S) and magnetic poles 18 and 22 with north (N). The optimum dimension between opposite varying magnetic poles is dependent on the thickness of the process gas chamber insulating window, the frequency of the radio frequency power, and the mean free path of the electrons, as a function of chamber pressure. Such dimension can be empirically derived.

Figure 3A:
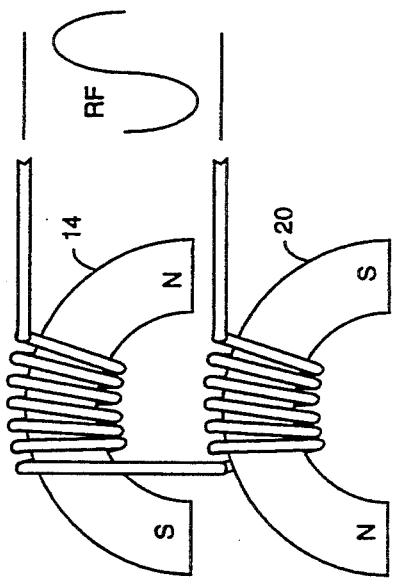
FIGS. 3A and 3B are side views of the ferromagnetic core coils showing the magnetic poles corresponding to FIGS. 2A and 2B.
Figure 3B:
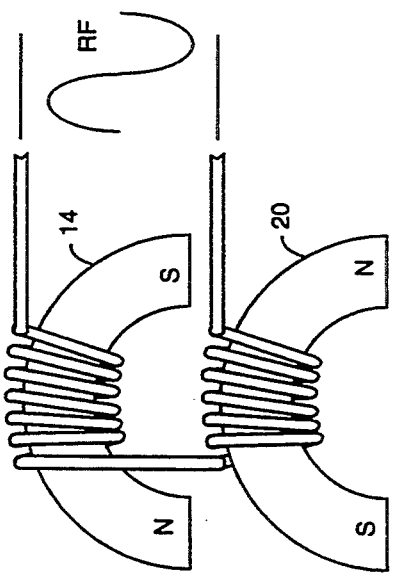

FIGS. 3A and 3B illustrate ferromagnetic core coils 14 and 20 as they correspond to FIGS. 2A and 2B.

Electrons in a process gas contained in a chamber proximate to the system 10 will be accelerated at right angles to the varying magnetic fields between adjacent varying magnetic poles. Since there are adjacent magnetic poles in two dimensions in the plane of FIGS. 2A and 2B, electron acceleration occurs in two dimensions. The elongated cores as shown in FIG. 6 have varying magnetic fields in one dimension, with a resulting electron acceleration in one dimension that is a right angle to the varying magnetic field.

The intensity of the magnetic field between the opposite magnetic poles decreases rapidly with distance from the poles when this distance exceeds about a quarter of the distance between the poles. Since the minimum thickness of the window is determined by the strength required to withstand the pressure difference between the inside and the outside of the chamber, the typical minimum window thickness is 0.5 inch for a fourteen inch diameter quartz window, and increases in thickness for larger diameter windows. As such, a minimum varying magnetic pole spacing of about two inches is indicated.

The frequency of the radio frequency power provided by the RF source 30 influences the optimum spacing between the opposite varying magnetic poles because the velocity of an electron with a kinetic energy equal or above the molecular ionization energy should have a relation to the 180 degree phase shift of the accelerating varying magnetic field between one set of opposite polarity poles and the adjacent set of poles. For a kinetic energy of twelve electron volts, typical of molecular ionization energy, the distance traveled in a half cycle at 13.56 MHz is about three inches.

The mean free path of the electrons affects the optimum spacing of the varying magnetic poles because, if the mean free path of the electrons is significantly less than the varying pole spacing, the flux of energized electrons will have significant variation between varying magnetic poles. This can lead to non-uniform processing. The electron mean free path in a typical molecular process gas varies from about one inch at seven millitorr of pressure to about five inches at two millitorr.

Typical U-cores are made by cutting a toroid powdered iron core into two pieces, e.g., a Micrometals T400-2. In order to decrease the maximum magnetic flux density in the core, and thus the core power loss, two cores can be included at each location for a two-dimensional configuration, thus doubling the core cross sectional area. For a one-dimensional configuration, a number of cores can be stacked to provide a substantially continuous elongated core.

There can be significant power losses in the powdered iron core due to varying electric fields, since the powdered iron core material can have high dielectric losses. These dielectric losses are separate from and essentially independent of the varying magnetic field core losses. The dielectric losses can be reduced by spacing the windings away from the cores and by using fewer turns with higher current in each turn to reduce the voltage across the windings. For operation at 13.56 MHz, the windings will typically consist of three to fifteen turns for the two dimensional configuration and one to seven turns for the one dimensional configuration.

A steady state, DC-induced magnetic field with an axis that is perpendicular to the insulated window in a process gas chamber can be used to curve the path of excited electrons in a generated plasma to be in a plane that is parallel to the window, and thereby to reduce the number of the energized electrons that will encounter the inside walls of the process gas chamber.

FIG. 4 illustrates a second ferromagnetic core coil plasma excitation system embodiment of the present invention, referred to by the general reference numeral 50. System 50 is also intended to be placed proximate to an insulating window of a chamber that contains a low pressure process gas. The system 50 comprises mounting plate 52 that supports a first ferromagnetic core coil 54 with a pair of magnetic poles 56 and 58, a second ferromagnetic core coil 60 with a pair of magnetic poles 62 and 64, a third ferromagnetic core coil 66 with a pair of magnetic poles 68 and 70, a fourth ferromagnetic core coil 72 with a pair of magnetic poles 74 and 76, a fifth ferromagnetic core coil 78 with a pair of magnetic poles 80 and 82, and a sixth ferromagnetic core coil 84 with a pair of magnetic poles 86 and 88. Ferromagnetic core coils 54, 60 and 72 are wired in parallel, as are ferromagnetic core coils 66, 78 and 84, and both are wired in series with a variable capacitor 90. Radio frequency (RF) power is coupled into system 50 through an air-core variable transformer 92 from a RF source 94. A typical operating frequency of 13.56 MHz is used for RF power source 94. Ferromagnetic core coils 54, 60, 66, 72, 78 and 84 preferably comprise several turns of copper wire or tubing on a half-toroid/ferromagnetic core or U-core with a generous space allowed between the windings and the core to promote cooling and to limit the heating that would otherwise result from a too tightly coupled winding. Forced air cooling for the windings may be necessary in certain implementations. The mounting plate 52 is an aluminum sheet with holes cut to allow the magnetic poles to peek out toward a process gas chamber window, and a slot cut through the aluminum sheet from each hole to an adjacent hole. Insulating rings or collars to grommet the magnetic poles in the mounting sheet 52 can be used to provide mounting support for the ferromagnetic core coils.

FIGS. 5A and 5B illustrate the physical relationships between the magnetic, poles. Each magnetic pole is separated from the adjacent poles by a substantially equal distance "D". FIG. 5A is similar to FIG. 2A and illustrates the magnetic polarities of each magnetic pole for one cycle of RF input power. FIG. 5B is similar to FIG. 2B and illustrates the magnetic polarities of each magnetic pole for a next half cycle of RF input power. As in system 10, the optimum dimension between opposite varying magnetic poles is dependent on the thickness of the process gas chamber insulating window, the frequency of the radio frequency power, and the mean free path of the electrons, as a function of chamber pressure. Such dimension can be empirically derived.

The ferromagnetic core coils used in systems 10 and 50 may comprise windings wound on U-cores, segments of toroids, or I-cores standing perpendicular on plates 12 and 52 with the ends opposite to the plates 12 and 52 magnetically completed with bars bussed from individual I-cores in a row or with a sheet of magnetic material capping a group of such I-cores.

FIG. 6 illustrates a configuration with two elongated ferromagnetic core coils for generating a single-dimensional electron acceleration field. A plasma induction system 100 comprises a first ferromagnetic core coil 102 with a pair of elongated magnetic poles 104 and 106, and a second ferromagnetic core coil 108 with a pair of elongated magnetic poles 110 and 112. Ferromagnetic core coils 102 and 108 may individually be constructed of a stack of U-core, I-core or half-toroid material. The same ferromagnetic cores used in systems 10 and 50 may be stacked to form the elongated ferromagnetic cores 102 and 108. The magnetic poles are set apart an equal distance "D". Each magnetic pole is elongated in a dimension "W" as compared to a dimension "T". The dimension "W" may be as large as an insulating window in a process gas chamber is in diameter. For example, fourteen inches.

Non-magnetic cores can alternatively be substituted for the ferromagnetic cores with suitable changes in the coil windings. This can reduce core losses but will increase winding losses.

The mounting plates 12 and 52 do more than just support the coils that generate the varying magnetic poles. They provide a uniform electrical field potential surface, which becomes more important when an additional source of radio frequency power is used to increase the ion field, e.g., ion kinetic energy. Such an additional radio frequency power source may be conventionally applied to a semiconductor wafer electrode with the mounting plate AC grounded, or vice versa. Alternatively, the wafer electrode and the mounting plate can both be separately driven with an appropriate AC phase shift between them, or driven at different AC frequencies.

The mounting plates 12 and 52 can be configured to help withstand the difference in pressure between the ambient and the chamber interior. For example, the mounting plate can alternatively be mounted inside the chamber and forced against the insulating window by the pressure differences. The magnetic poles are then positioned against the outside of the window. Thus the window areas subjected to pressure differences are those associated with the holes and slots for each pair of magnetic poles. It is therefore possible to save on construction costs compared to the prior art by reducing the material thickness of the insulating window. Such an arrangement is particularly advantageous where larger plasma areas are being used, such as in the fabrication of liquid crystal displays.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An apparatus for generating a low pressure plasma, comprising:
    a chamber for enclosing process gases at reduced pressures and including means for controlling gas pressure and flow;
    an approximately planar insulating window for passing varying magnetic fields at radio frequencies from outside the chamber into said process gases; and
    means for four or more radio frequency varying magnetic poles in proximity to said insulated window, with adjacent varying magnetic poles of opposite polarity and approximately equally spaced for connection to an alternating current radio frequency power source, wherein a radio frequency varying magnetic field from said varying magnetic poles is coupled through said planar insulating window to create a plasma within said chamber.

2. The apparatus of claim 1, wherein:
    the means for four or more radio frequency varying magnetic poles is such that each of the poles is elongated in one dimension with said approximately equal spacing in a dimension perpendicular to said magnetic pole elongation and parallel to said insulating window.

3. The apparatus of claim 1, wherein:
    said adjacent opposite polarity magnetic poles are approximately equally spaced in two dimensions.

4. The apparatus of claim 1, further comprising:
    steady-state magnetic means for passing a constant magnetic field through said window into said chamber providing for constant magnetic field lines that are approximately perpendicular to said window.

5. An apparatus for generating a low pressure plasma, comprising:
    a chamber for enclosing process gases at reduced pressures and including means for controlling gas pressure and flow;
    an approximately planar insulating window for passing varying magnetic fields from outside the chamber into said process gases; and
    means for four or more varying magnetic poles in proximity to said insulated window, with adjacent varying magnetic poles of opposite polarity and approximately equally spaced, wherein each of the poles is elongated in one dimension with said approximately equal spacing in a dimension perpendicular to said magnetic pole elongation and parallel to said insulating window.

6. The apparatus of claim 5, wherein the means for four or more varying magnetic poles includes:
    opposite polarity pairs of said elongated varying magnetic poles which comprise ferromagnetic cores with a U-shaped cross section with the dimension of said ferromagnetic core perpendicular to said cross section substantially larger than the dimension between the ends of said U-shaped cross section of said ferromagnetic core;
    one or more turns of a conductor carrying a varying electric current through the inside of said U-shaped ferromagnetic core; and
    the open side of said U-shaped cross section ferromagnetic core is placed adjacent to said insulating window.

7. The apparatus of claim 5, wherein the means for four or more varying magnetic poles includes:
- opposite polarity pairs of said elongated varying magnetic poles are formed by non-magnetic cores with a U-shaped cross section with the dimension of said non-magnetic core perpendicular to said cross section larger than the dimension between the ends of said U-shaped cross section of said non-magnetic core;
- four or more turns of a conductor carrying a varying electric current through the inside of said U-shaped non-magnetic core; and
- the open side of said U-shaped cross section non-magnetic core is placed adjacent to said insulating window.

8. An apparatus for generating a low pressure plasma, comprising:
- a chamber for enclosing process gases at reduced pressures and including means for controlling gas pressure and flow;
- an approximately planar insulating window for passing varying magnetic fields from outside the chamber into said process gases; and
- means for four or more varying magnetic poles in proximity to said insulated window, with adjacent varying magnetic poles of opposite polarity and approximately equally spaced, wherein said adjacent opposite polarity magnetic poles are approximately equally spaced in two dimensions.

9. The apparatus of claim 8, wherein:
- the means for four or more varying magnetic poles includes two or more sets of two opposite polarity varying magnetic poles, each set of which is formed by the ends of a U-shaped ferromagnetic core about which is wound one or more turns of a conductor carrying a varying electric current.

10. The apparatus of claim 8, wherein:
- the means for four or more varying magnetic poles includes varying magnetic poles formed by I-shaped ferromagnetic cores about which are wound one or more turns of a conductor carrying a varying electrical current, with said I-cores mounted approximately perpendicular to said window and the direction of current flow opposite for adjacent ferromagnetic I-cores.

11. The apparatus of claim 10, wherein:
- the means for four or more varying magnetic poles further includes additional ferromagnetic cores for coupling the varying magnetic fields between two or more of the ends of said I-cores opposite to said window.

12. The apparatus of claim 8, further comprising:
- a conductive sheet placed between said varying magnetic poles and said window and having holes corresponding to the position and size of said varying magnetic poles and having slots cut through said conductive sheet that join each hole to an adjacent hole, and having means for connecting said conductive sheet to a ground or to a source of radio frequency power.

13. The apparatus of claim 8, wherein:
- the means for four or more varying magnetic poles includes two or more sets of two opposite polarity varying magnetic poles, each set of which is formed by the ends of a U-shaped non-magnetic core about which is wound four or more turns of a conductor for carrying a varying electric current.

14. An apparatus for generating a low-pressure plasma in a chamber containing a process gas through an insulating window in the chamber, comprising:
- a plurality of ferromagnetic core coils having respective magnetic poles placed proximate to said insulating window in at least a two-by-two array in a plane and connected with each magnetic pole surrounded by adjacent magnetic poles of opposite magnetic polarity, wherein in each two-by-two array, the two sets of opposite corners instantaneously have opposite magnetic polarities.

15. The apparatus of claim 14, wherein:
- the plurality of ferromagnetic core coils comprises ferromagnetic core coils having a U-shaped ferromagnetic core with open ends of said core oriented in a single direction to face said insulating window and having approximately equal spacings between each open end of each core and open ends of adjacent cores.

16. The apparatus of claim 14, further comprising:
- a variable capacitor in series with the plurality of ferromagnetic core coils; and
- a variable transformer having a secondary winding connected to the series combination of the variable capacitor and the plurality of ferromagnetic core coils and having a primary winding for receiving a radio frequency power input.

17. The apparatus of claim 14, further comprising:
- a direct current bias coil surrounding the plurality of ferromagnetic core coils in a plane parallel to said insulating window and having connections for a source of direct current, wherein a migration of electrons within said plasma is controlled to avoid the inner walls of said process chamber.

18. The apparatus of claim 14, further comprising:
- a conductive sheet having holes at positions corresponding to said magnetic poles which provide access for each ferromagnetic core coil to said insulating window and an open slot between pairs of said holes.

19. An apparatus for generating a low-pressure plasma in a chamber containing a process gas through an insulating window in the chamber, comprising:
- a plurality of ferromagnetic core coils in a row having respective elongated magnetic poles placed proximate to said insulating window in at least a one-by-four array in a plane and connected with each magnetic pole surrounded on either side by adjacent magnetic poles of opposite magnetic polarity, wherein said magnetic poles are elongated in a direction orthogonal to said row.

20. The apparatus of claim 19, wherein:
- the plurality of ferromagnetic core coils comprise ferromagnetic core coils having a U-shaped ferromagnetic core with open ends of said core oriented in a single direction to face said insulating window and having approximately equal spacings between each open end of the core and open ends of adjacent cores.

21. The apparatus of claim 19, further comprising:
- a variable capacitor in series with the plurality of ferromagnetic core coils; and
- a variable transformer having a secondary winding connected to the series combination of the variable capacitor and the plurality of ferromagnetic core coils and having a primary winding for receiving a radio frequency power input.

* * * * *